(12) United States Patent
Feng

(10) Patent No.: US 12,068,727 B2
(45) Date of Patent: Aug. 20, 2024

(54) NON-ISOLATED SINGLE-INDUCTOR CIRCUIT FOR OUTPUTTING POSITIVE AND NEGATIVE LOW-VOLTAGE POWER

(71) Applicant: Guangdong Giwee Technology Co. Ltd., Foshan (CN)

(72) Inventor: Shanghua Feng, Foshan (CN)

(73) Assignee: GUANGDONG GIWEE TECHNOLOGY CO. LTD., Foshan (CN)

( * ) Notice: Subject to any disclaimer, the term of this patent is extended or adjusted under 35 U.S.C. 154(b) by 468 days.

(21) Appl. No.: 17/523,211

(22) Filed: Nov. 10, 2021

(65) Prior Publication Data

US 2022/0149799 A1    May 12, 2022

(30) Foreign Application Priority Data

Nov. 11, 2020    (CN) .......................... 202022601048.1

(51) Int. Cl.
    *H03F 1/12*     (2006.01)
    *H03F 3/08*     (2006.01)
    *H03F 3/21*     (2006.01)
    *H03F 3/45*     (2006.01)

(52) U.S. Cl.
    CPC ............. *H03F 3/4508* (2013.01); *H03F 3/08* (2013.01); *H03F 3/21* (2013.01); *H03F 2203/21112* (2013.01); *H03F 2203/21151* (2013.01); *H03F 2203/21157* (2013.01); *H03F 2203/45218* (2013.01)

(58) Field of Classification Search
    CPC .................................... H03F 1/12; H03F 1/34
    USPC .......................................................... 330/51
    See application file for complete search history.

(56) References Cited

U.S. PATENT DOCUMENTS

| 6,650,095 B2 | 11/2003 | Aiello et al. | |
|---|---|---|---|
| 2008/0143309 A1 | 6/2008 | Odell et al. | |
| 2015/0365003 A1* | 12/2015 | Sadwick ................. | H02M 3/28 363/21.01 |
| 2018/0323713 A1* | 11/2018 | Beland ................ | H02M 3/1582 |

FOREIGN PATENT DOCUMENTS

JP    S5123641 A    2/1976

OTHER PUBLICATIONS

European Search Report for Application No. 21207454.6; Issued Apr. 4, 2022; 10 Pages.

\* cited by examiner

*Primary Examiner* — Henry Choe
(74) *Attorney, Agent, or Firm* — CANTOR COLBURN LLP

(57) ABSTRACT

A non-isolated power supply. A positive power and a negative power are respectively formed by charging a +VCC1 energy storage filter and a −VCC2 energy storage filter connected in series and discharging the +VCC1 energy storage filter 102 and the −VCC2 energy storage filter. The output positive and negative power may be differently combined by changing the capacities of the +VCC1 energy storage filter and the −VCC2 energy storage filter and may be equal or unequal.

10 Claims, 2 Drawing Sheets

NON-ISOLATED SINGLE-INDUCTOR CIRCUIT FOR OUTPUTTING POSITIVE AND NEGATIVE LOW-VOLTAGE POWER

FOREIGN PRIORITY

This application claims priority to Chinese Patent Application No. 202022601048.1, filed Nov. 11, 2020, and all the benefits accruing therefrom under 35 U. S. C. § 119, the contents of which in its entirety are herein incorporated by reference.

TECHNICAL FIELD

The disclosure relates to the technical field of power supplies, and, to a non-isolated single-inductor circuit for outputting positive and negative low-voltage power.

BACKGROUND

A loop through which electrical current flows is called an electrical circuit, also called an electrically conductive loop. The simplest electrical circuit is composed of a power supply, an electrical appliance (load), a conductor, a switch, and other components. A conductively connected circuit is called a conducted circuit. Only with the conducted circuit, current may pass through the circuit. A circuit with a certain point disconnected is called a short circuit or an open circuit. This situation is never allowed if there is no load but a direct connection between positive and negative electrodes of the power supply in the circuit, which is called a short circuit.

A non-isolated power supply means that an input end and a load end are not electrically isolated through a transformer, but directly connected. The input end and the load end are connected to a common ground. A present conventional topology structure outputs only uniform positive power and cannot output negative power, which cannot satisfy an application requirement of dual power supply for an operational amplifier, while a solution of using a transformer to generate positive and negative power may lose advantage in cost.

SUMMARY

An object of embodiments of the disclosure is to provide a non-isolated single-inductor circuit for outputting positive and negative low-voltage power, aiming to solve the problems that a current conventional topology structure outputs only single positive power and cannot output negative power and the application requirements of an operational amplifier with dual power supply cannot be met.

In order to achieve the above object, the disclosure adopts the following technical solutions.

A non-isolated single-inductor circuit for outputting positive and negative low-voltage power is provided, including: a circuit input end, a circuit output end, a switch module, an energy storage inductor, a +VCC1 energy storage filter, a −VCC2 energy storage filter, and an inductor freewheel diode.

The circuit input end, the switch module, the energy storage inductor, the +VCC1 energy storage filter, and the circuit output end are sequentially connected in series. A conducting direction of the +VCC1 energy storage filter is from the circuit input end to the circuit output end.

The −VCC2 energy storage filter and the inductor freewheel diode are connected in series, and an input end of the −VCC2 energy storage filter is connected between the +VCC1 energy storage filter and the circuit output end. An output end of the inductor freewheel diode is connected between the energy storage inductor and the switch module.

When the switch module is turned on, the energy storage inductor and the +VCC1 energy storage filter are charged.

When the switch module is turned off, the energy storage inductor charges the +VCC1 energy storage filter and the −VCC2 energy storage filter, the +VCC1 energy storage filter outputs positive power, and the −VCC2 energy storage filter outputs negative power.

Further, an output feedback circuit is also included. The output feedback circuit and the energy storage inductor are connected to form a closed-loop circuit. A voltage of the output feedback circuit is fed back to the switch module to form a closed-loop control. When the switch module is turned off, the output feedback circuit is charged, and a target voltage of the formed closed-loop control is the sum of absolute values of the +VCC1 and the −VCC2.

Further, the output feedback circuit includes a diode and a first energy storage filter connected in series. A first end of the energy storage inductor is connected to the diode. A second end of the energy storage inductor is connected to the first energy storage filter. Conducting directions of the first energy storage filter and the diode are both from the first end of the energy storage inductor to the second end of the energy storage inductor. A discharging direction of the energy storage inductor is from the first end to the second end.

Further, the output feedback circuit also includes at least one resistor. One end of the resistor is connected between the diode and the first energy storage filter, and the other end of the resistor is connected between the first energy storage filter and the second end of the energy storage inductor. The resistor is connected to the switch module.

Further, a +VCC1 voltage-stabilizing circuit connected in parallel with the +VCC1 energy storage filter is also included. The +VCC1 voltage-stabilizing circuit is configured to stabilize a voltage of the +VCC1 energy storage filter.

Further, the +VCC1 voltage-stabilizing circuit includes a first triode and a first clamp diode. An emitter of the first triode is connected between the energy storage inductor and the +VCC1 energy storage filter. A collector of the first triode is connected between the +VCC1 energy storage filter and the −VCC2 energy storage filter. A base of the first triode is connected in series with a first end of the first clamp diode. A second end of the first clamp diode is connected between the +VCC1 energy storage filter and the −VCC2 energy storage filter.

Further, a −VCC2 voltage-stabilizing circuit connected in parallel with the −VCC2 energy storage filter is also included. The −VCC2 voltage-stabilizing circuit is configured to stabilize a voltage of the −VCC2 energy storage filter.

Further, the −VCC2 voltage-stabilizing circuit includes a second triode and a second clamp diode. An emitter of the second triode is connected between the +VCC1 energy storage filter and the −VCC2 energy storage filter. A collector of the second triode is connected between the −VCC2 energy storage filter and the inductor freewheel diode. A base of the second triode is connected in series with a first end of the second clamp diode. A second end of the second clamp diode is connected between the −VCC2 energy storage filter and the inductor freewheel diode.

Further, a power indicator circuit connected in parallel with the +VCC1 energy storage filter is also included. The power indicator circuit includes a third resistor and an LED lamp connected in series.

Further, a second energy storage filter is also included. A first end of the second energy storage filter is connected between the circuit input end and the switch module. A second end of the second energy storage filter is connected between the circuit output end and the +VCC1 energy storage filter. A conducting direction of the second energy storage filter is from the circuit input end to the circuit output end.

Compared with the prior art, the disclosure has the following beneficial effects. In the disclosure, positive power and negative power are respectively formed by charging a +VCC1 energy storage filter and a -VCC2 energy storage filter connected in series and discharging the +VCC1 energy storage filter and the -VCC2 energy storage filter. The cost is low. The output positive and negative power may be differently combined by changing the capacities of the +VCC1 energy storage filter and the -VCC2 energy storage filter and may be equal or unequal.

BRIEF DESCRIPTION OF THE DRAWINGS

The disclosure will be described in further detail below with reference to the accompanying drawings and embodiments.

Figure 1:
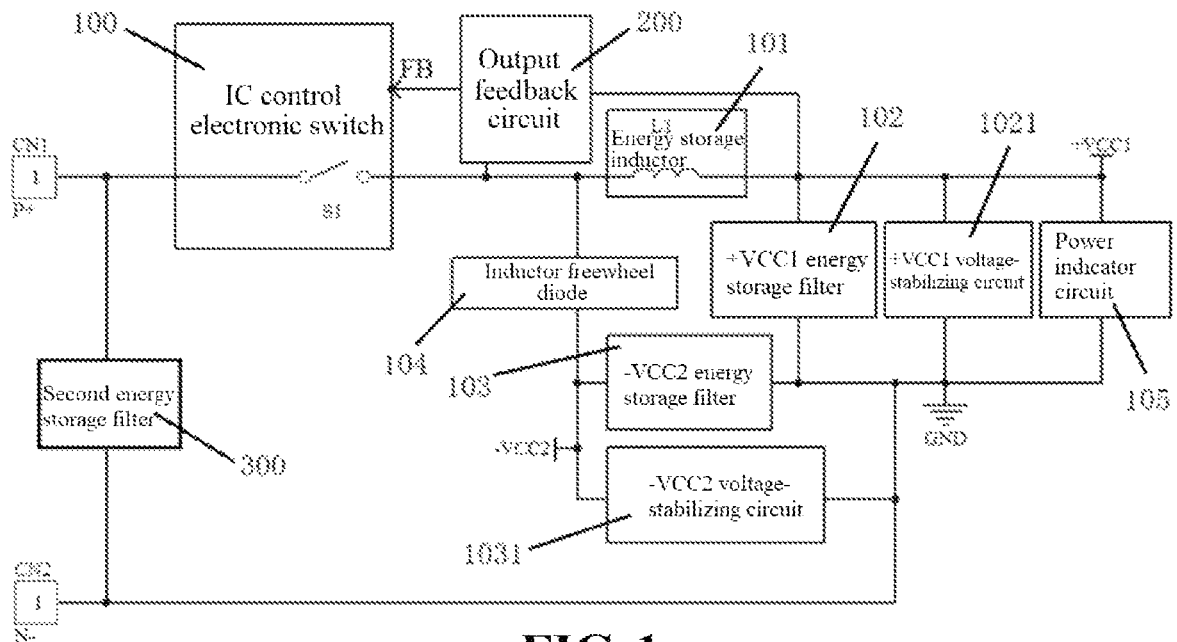
FIG. 1 is a circuit schematic block diagram of a non-isolated single-inductor circuit for outputting positive and negative low-voltage power according to an embodiment.

In the drawings:
100: Switch module; 101: energy storage inductor; 102: +VCC1 energy storage filter; 1021: +VCC1 voltage-stabilizing circuit; 103: -VCC2 energy storage filter; 1031: -VCC2 voltage-stabilizing circuit; 104: inductor freewheel diode; 105: power indicator circuit; 200: output feedback circuit; 300: second energy storage filter.

DETAILED DESCRIPTION

In order to make the technical problems to be solved, the technical solutions to be adopted and the technical effects to be achieved by the disclosure clearer, the technical solutions of the embodiments of the disclosure will be described in further detail below. Apparently, the described embodiments are only a part of the embodiments of the disclosure, rather than all the embodiments. Based on the embodiments in the disclosure, all the other embodiments obtained by a person skilled in the art without any inventive effort fall within the scope of protection of the disclosure.

A non-isolated power supply means that an input end and a load end are not electrically isolated through a transformer, but directly connected. The input end and the load end are connected to a common ground. A present conventional topology structure outputs only uniform positive power and cannot output negative power, which cannot satisfy an application requirement of dual power supply for an operational amplifier, while a solution of using a transformer to generate positive and negative power may lose advantage in cost.

In the disclosure, positive power and negative power are respectively formed by charging a +VCC1 energy storage filter 102 and a -VCC2 energy storage filter 103 connected in series and discharging the +VCC1 energy storage filter 102 and the -VCC2 energy storage filter 103. The cost is low. The output positive and negative power may be differently combined by changing the capacities of the +VCC1 energy storage filter 102 and the -VCC2 energy storage filter 103 and may be equal or unequal.

Figure 2:
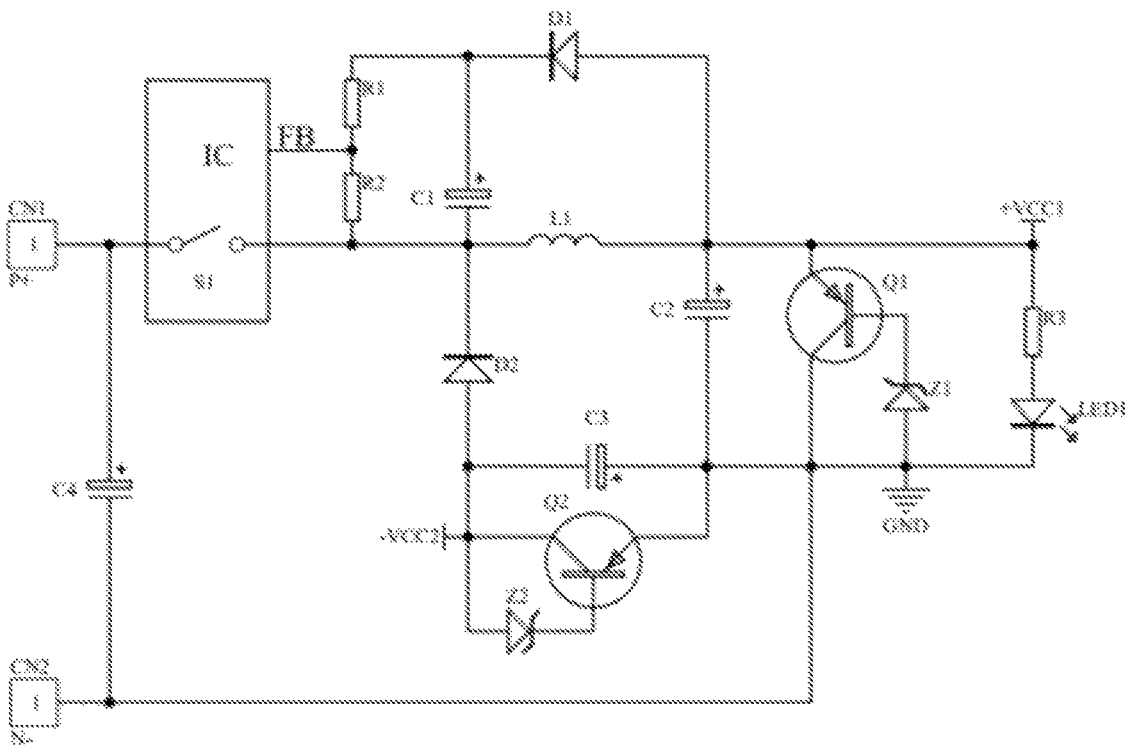
FIG. 2 is a circuit schematic diagram of a non-isolated single-inductor circuit for outputting positive and negative low-voltage power according to an embodiment.
Figure 3:
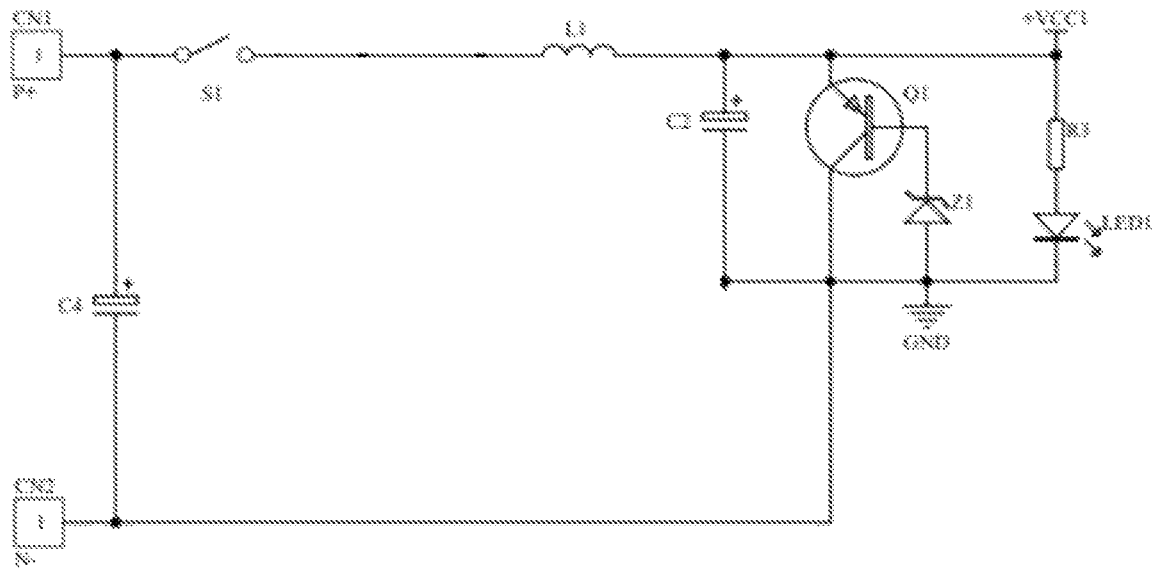
FIG. 3 is a schematic diagram of a current path when a switch module of a non-isolated single-inductor circuit for outputting positive and negative low-voltage power is turned on according to an embodiment.
Figure 4:
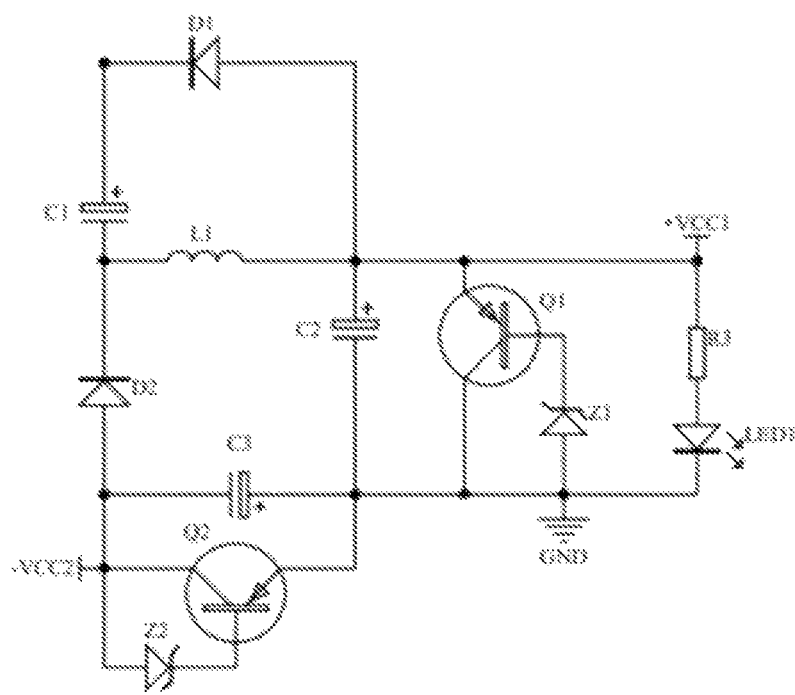
FIG. 4 is a schematic diagram of a current path when a switch module of a non-isolated single-inductor circuit for outputting positive and negative low-voltage power is turned off according to an embodiment.

In the disclosure, FIG. 1 is a circuit schematic block diagram of a non-isolated single-inductor circuit for outputting positive and negative low-voltage power. FIG. 2 is a circuit schematic diagram of a non-isolated single-inductor circuit for outputting positive and negative low-voltage power. FIG. 3 is a schematic diagram of a current path when a switch module 100 of a non-isolated single-inductor circuit for outputting positive and negative low-voltage power is turned on. FIG. 4 is a schematic diagram of a current path when a switch module 100 of a non-isolated single-inductor circuit for outputting positive and negative low-voltage power is turned off.

As shown in FIG. 1, the present embodiment provides a non-isolated single-inductor circuit for outputting positive and negative low-voltage power, including: a circuit input end, a circuit output end, a switch module 100, an energy storage inductor 101, a +VCC1 energy storage filter 102, a -VCC2 energy storage filter 103, and an inductor freewheel diode 104.

The circuit input end, the switch module 100, the energy storage inductor 101, the +VCC1 energy storage filter 102, and the circuit output end are sequentially connected in series. A conducting direction of the +VCC1 energy storage filter 102 is from the circuit input end to the circuit output end.

The -VCC2 energy storage filter 103 and the inductor freewheel diode 104 are connected in series, and an input end of the -VCC2 energy storage filter 103 is connected between the +VCC1 energy storage filter 102 and the circuit output end. An output end of the inductor freewheel diode 104 is connected between the energy storage inductor 101 and the switch module 100.

When the switch module 100 is turned on, the energy storage inductor 101 and the +VCC1 energy storage filter 102 are charged.

When the switch module 100 is turned off, the energy storage inductor 101 charges the +VCC1 energy storage filter 102 and the -VCC2 energy storage filter 103, the +VCC1 energy storage filter 102 outputs positive power, and the -VCC2 energy storage filter 103 outputs negative power.

The circuit input end and the circuit output end are high-voltage direct-current power inputs. The switch module 100 includes a semiconductor switch device controlled by a conventional non-isolated BUCK control IC. The IC is put into operation after the non-isolated single-inductor circuit for outputting positive and negative low-voltage power is powered on. The semiconductor switch device is periodically turned on and off under the control of PWM.

As shown in FIG. 3, when the semiconductor switch device is turned on, a current flow from the circuit input end, the switch module 100, the energy storage inductor 101, and the +VCC1 energy storage filter 102 to the circuit output end. At this moment, the energy storage inductor 101 and the +VCC1 energy storage filter 102 are in a charging process.

As shown in FIG. 4, when the semiconductor switch device is turned off, the energy storage inductor 101 is in a discharging process, and a current flow from a first end of the energy storage inductor 101, the +VCC1 energy storage filter 102, the −VCC2 energy storage filter 103, and the inductor freewheel diode 104 to a second end of the energy storage inductor 101. It can be understood that a conducting direction of the inductor freewheel diode 104 is from the first end of the energy storage inductor 101 to the second end of the energy storage inductor 101. The second end of the energy storage inductor 101 is connected to the switch module 100.

It can be understood that when the switch module 100 is turned on, the +VCC1 energy storage filter 102 is charged once. When the switch module 100 is turned off, the +VCC1 energy storage filter 102 is charged once, and the −VCC2 energy storage filter 103 is charged once. In the whole process, the +VCC1 energy storage filter 102 is charged twice, and the −VCC2 energy storage filter 103 is charged once, i.e., the amount of charge of the +VCC1 energy storage filter 102 is twice that of the −VCC2 energy storage filter 103. According to a capacitance voltage calculation formula U=Q/C, Q is the amount of charge and discharge, and C is capacitance. When the capacities of the +VCC1 energy storage filter 102 and the −VCC2 energy storage filter 103 are equal, an absolute value of a +VCC1 voltage is twice that of a −VCC2 voltage.

Further, an output feedback circuit 200 is also included. The output feedback circuit 200 and the energy storage inductor 101 are connected to form a closed-loop circuit. A voltage of the output feedback circuit is fed back to the switch module 100 to form a closed-loop control. When the switch module 100 is turned off, the output feedback circuit 200 is charged, and a target voltage of the formed closed-loop control is the sum of absolute values of the +VCC1 and the −VCC2.

Specifically, the output feedback circuit 200 is configured to feed back the sum of absolute values of the +VCC1 and the −VCC2 to the control IC. The control IC compares a target voltage with the sum of absolute values of the +VCC1 and the −VCC2 and controls the on or off the semiconductor switch device according to a comparison structure.

It can be understood that a first end of the output feedback circuit 200 is connected to the first end of the energy storage inductor 101, and a second end of the output feedback circuit 200 is connected to the second end of the energy storage inductor 101, so as to form the closed-loop circuit. After the energy storage inductor 101 divides a voltage for the output feedback circuit 200, the output feedback circuit 200 provides an FB feedback signal to the switch module 100 so as to form the closed-loop control.

In the disclosure, the output feedback circuit 200 includes a diode and a first energy storage filter connected in series. A first end of the energy storage inductor 101 is connected to the diode. A second end of the energy storage inductor 101 is connected to the first energy storage filter. Conducting directions of the first energy storage filter and the diode are both from the first end of the energy storage inductor 101 to the second end of the energy storage inductor 101. A discharging direction of the energy storage inductor 101 is from the first end to the second end.

When the switch module 100 is turned off, the energy storage inductor 101 is discharged, and the energy storage inductor 101 charges the first energy storage filter, the +VCC1 energy storage filter 102 and the −VCC2 energy storage filter 103 respectively. It can be understood that the voltage of the first energy storage filter may be fed back as the sum of an absolute value of an output voltage of the +VCC1 energy storage filter 102 and an absolute value of an output voltage of the −VCC2 energy storage filter.

Further, the output feedback circuit 200 also includes at least one resistor. One end of the resistor is connected between the diode and the first energy storage filter, and the other end of the resistor is connected between the first energy storage filter and the second end of the energy storage inductor 101. The resistor is connected to the switch module 100.

In the disclosure, a +VCC1 voltage-stabilizing circuit 1021 connected in parallel with the +VCC1 energy storage filter 102 is also included. The +VCC1 voltage-stabilizing circuit 1021 is configured to stabilize a voltage of the +VCC1 energy storage filter 102.

In a practical circuit, respective loads of positive and negative power may not completely equal. In order to ensure respective stabilization of positive and negative voltages, the +VCC1 voltage-stabilizing circuit 1021 is connected in parallel to the +VCC1 energy storage filter 102.

Further, the +VCC1 voltage-stabilizing circuit 1021 includes a first triode and a first clamp diode. An emitter of the first triode is connected between the energy storage inductor 101 and the +VCC1 energy storage filter 102. A collector of the first triode is connected between the +VCC1 energy storage filter 102 and the −VCC2 energy storage filter 103. A base of the first triode is connected in series with a first end of the first clamp diode. A second end of the first clamp diode is connected between the +VCC1 energy storage filter 102 and the −VCC2 energy storage filter 103.

Since the +VCC1 voltage exceeds a target value due to load imbalance, the first clamp diode is conducted to provide a B-electrode current for the first triode, and the first triode is conducted and discharged in parallel until the +VCC1 voltage is lowered, and finally reaches a dynamic voltage stabilization at the target value.

In the disclosure, a −VCC2 voltage-stabilizing circuit 1031 connected in parallel with the −VCC2 energy storage filter 103 is also included. The −VCC2 voltage-stabilizing circuit 1031 is configured to stabilize a voltage of the −VCC2 energy storage filter 103.

In a practical circuit, respective loads of positive and negative power may not completely equal. In order to ensure respective stabilization of positive and negative voltages, the −VCC2 voltage-stabilizing circuit 1031 is connected in parallel to the −VCC2 energy storage filter 103.

Further, the −VCC2 voltage-stabilizing circuit 1031 includes a second triode and a second clamp diode. An emitter of the second triode is connected between the +VCC1 energy storage filter 102 and the −VCC2 energy storage filter 103. A collector of the second triode is connected between the −VCC2 energy storage filter 103 and the inductor freewheel diode 104. A base of the second triode is connected in series with a first end of the second clamp diode. A second end of the second clamp diode is connected between the −VCC2 energy storage filter 103 and the inductor freewheel diode 104.

Since the −VCC2 voltage exceeds a target value due to load imbalance, the second clamp diode is conducted to provide a B-electrode current for the second triode, and the second triode is conducted and discharged in parallel until the −VCC2 voltage is lowered, and finally reaches a dynamic voltage stabilization at the target value.

Further, a power indicator circuit 105 connected in parallel with the +VCC1 energy storage filter 102 is also included. The power indicator circuit 105 includes a third resistor and an LED lamp connected in series. The LED lamp is configured to indicate the working of a power supply.

In the disclosure, a second energy storage filter 300 is also included. A first end of the second energy storage filter 300 is connected between the circuit input end and the switch module 100. A second end of the second energy storage filter 300 is connected between the circuit output end and the +VCC1 energy storage filter 102. A conducting direction of the second energy storage filter 300 is from the circuit input end to the circuit output end.

In the description of this specification, reference to the description of the terms "one embodiment", "example", etc. means that specific features, structures, materials, or characteristics described in connection with the embodiment or example are included in at least one embodiment or example of the disclosure. In this specification, schematic representations of the above terms are not necessarily directed to the same embodiments or examples.

In addition, it should be understood that while this specification has been described in terms of the implementations, not every implementation includes an independent technical solution. Such recitation of the specification is for clarity purposes only, and a person skilled in the art will recognize the specification. The technical solutions in all the embodiments may be appropriately combined to form other implementations as may be appreciated by a person skilled in the art.

The technical principle of the disclosure is described above in connection with specific embodiments. These descriptions are only intended to explain the principles of the disclosure and should not be construed as limiting the scope of protection of the disclosure in any way. Based on the explanations herein, a person skilled in the art would have been able to conceive other specific implementations of the disclosure without involving any inventive effort, and these implementations would all fall within the scope of protection of the disclosure.

What is claimed is:

1. A non-isolated single-inductor circuit for outputting positive and negative low-voltage power, comprising:
    a circuit input end, a circuit output end, a switch module, an energy storage inductor, a +VCC1 energy storage filter, a −VCC2 energy storage filter, and an inductor freewheel diode,
    wherein the circuit input end, the switch module, the energy storage inductor, the +VCC1 energy storage filter, and the circuit output end are sequentially connected in series, and a conducting direction of the +VCC1 energy storage filter is from the circuit input end to the circuit output end,
    the −VCC2 energy storage filter and the inductor freewheel diode are connected in series, an input end of the −VCC2 energy storage filter is connected between the +VCC1 energy storage filter and the circuit output end, and an output end of the inductor freewheel diode is connected between the energy storage inductor and the switch module,
    when the switch module is turned on, the energy storage inductor and the +VCC1 energy storage filter are charged; and
    when the switch module is turned off, the energy storage inductor charges the +VCC1 energy storage filter and the −VCC2 energy storage filter, the +VCC1 energy storage filter outputs positive power, and the −VCC2 energy storage filter outputs negative power.

2. The non-isolated single-inductor circuit for outputting positive and negative low-voltage power according to claim 1, further comprising: an output feedback circuit, wherein the output feedback circuit and the energy storage inductor are connected to form a closed-loop circuit, a voltage of the output feedback circuit is fed back to the switch module to form a closed-loop control, when the switch module is turned off, the output feedback circuit is charged, and a target voltage of the formed closed-loop control is the sum of absolute values of the +VCC1 and the −VCC2.

3. The non-isolated single-inductor circuit for outputting positive and negative low-voltage power according to claim 2, wherein the output feedback circuit comprises a diode and a first energy storage filter connected in series, a first end of the energy storage inductor is connected to the diode, a second end of the energy storage inductor is connected to the first energy storage filter, conducting directions of the first energy storage filter and the diode are both from the first end of the energy storage inductor to the second end of the energy storage inductor, and a discharging direction of the energy storage inductor is from the first end to the second end.

4. The non-isolated single-inductor circuit for outputting positive and negative low-voltage power according to claim 3, wherein the output feedback circuit further comprises at least one resistor, one end of the resistor is connected between the diode and the first energy storage filter, the other end of the resistor is connected between the first energy storage filter and the second end of the energy storage inductor, and the resistor is connected to the switch module.

5. The non-isolated single-inductor circuit for outputting positive and negative low-voltage power according to claim 1, further comprising: a +VCC1 voltage-stabilizing circuit connected in parallel with the +VCC1 energy storage filter, wherein the +VCC1 voltage-stabilizing circuit is configured to stabilize a voltage of the +VCC1 energy storage filter.

6. The non-isolated single-inductor circuit for outputting positive and negative low-voltage power according to claim 5, wherein the +VCC1 voltage-stabilizing circuit comprises a first triode and a first clamp diode, an emitter of the first triode is connected between the energy storage inductor and the +VCC1 energy storage filter, a collector of the first triode is connected between the +VCC1 energy storage filter and the −VCC2 energy storage filter, a base of the first triode is connected in series with a first end of the first clamp diode, and a second end of the first clamp diode is connected between the +VCC1 energy storage filter and the −VCC2 energy storage filter.

7. The non-isolated single-inductor circuit for outputting positive and negative low-voltage power according to claim 6, further comprising: a −VCC2 voltage-stabilizing circuit connected in parallel with the −VCC2 energy storage filter, wherein the −VCC2 voltage-stabilizing circuit is configured to stabilize a voltage of the −VCC2 energy storage filter.

8. The non-isolated single-inductor circuit for outputting positive and negative low-voltage power according to claim 7, wherein the −VCC2 voltage-stabilizing circuit comprises a second triode and a second clamp diode, an emitter of the second triode is connected between the +VCC1 energy storage filter and the −VCC2 energy storage filter, a collector of the second triode is connected between the −VCC2 energy storage filter and the inductor freewheel diode, a base of the second triode is connected in series with a first end of the second clamp diode, and a second end of the second clamp diode is connected between the −VCC2 energy storage filter and the inductor freewheel diode.

9. The non-isolated single-inductor circuit for outputting positive and negative low-voltage power according to claim 5, further comprising: a power indicator circuit connected in parallel with the +VCC1 energy storage filter, wherein the power indicator circuit comprises a third resistor and an LED lamp connected in series.

10. The non-isolated single-inductor circuit for outputting positive and negative low-voltage power according to claim 1, further comprising: a second energy storage filter, wherein a first end of the second energy storage filter is connected between the circuit input end and the switch module, a second end of the second energy storage filter is connected between the circuit output end and the +VCC1 energy storage filter, and a conducting direction of the second energy storage filter is from the circuit input end to the circuit output end.

* * * * *